United States Patent
Sreenivasan

(10) Patent No.: US 7,670,953 B2
(45) Date of Patent: *Mar. 2, 2010

(54) POSITIVE TONE BI-LAYER METHOD

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 293 days.

This patent is subject to a terminal disclaimer.

(21) Appl. No.: 11/844,824

(22) Filed: Aug. 24, 2007

(65) Prior Publication Data

US 2008/0118872 A1     May 22, 2008

Related U.S. Application Data

(63) Continuation of application No. 11/611,287, filed on Dec. 15, 2006, now Pat. No. 7,323,417, and a continuation-in-part of application No. 11/560,928, filed on Nov. 17, 2006, now Pat. No. 7,261,831, which is a continuation of application No. 10/946,570, filed on Sep. 21, 2004, which is a continuation-in-part of application No. 10/850,876, filed on May 21, 2004, which is a continuation of application No. 10/396,615, filed on Mar. 25, 2003.

(51) Int. Cl.
    *H01L 21/311*       (2006.01)
(52) U.S. Cl. .................................... 438/700
(58) Field of Classification Search .............. 438/700, 438/735, 739, 745; 216/44, 52; 257/E21.215–E21.316
See application file for complete search history.

(56) References Cited

U.S. PATENT DOCUMENTS

| | | | |
|---|---|---|---|
| 3,795,534 | A | 3/1974 | Mehalso et al. |
| 4,038,110 | A | 7/1977 | Feng |
| 4,267,212 | A | 5/1981 | Sakawaki |
| 4,389,281 | A | 6/1983 | Anantha et al. |
| 4,426,247 | A | 1/1984 | Tamamura et al. |
| 4,507,331 | A | 3/1985 | Hiraoka |

(Continued)

FOREIGN PATENT DOCUMENTS

JP          09-311460          12/1997

(Continued)

OTHER PUBLICATIONS

Kotachi et al., Si-Containing Positive Resist for ArF Excimer Laser Lithography, Photopolymer Science and Technology, pp. 615-622 Nov. 4, 1995.

Haisma et al., Mold-assisted Nanolithography: A Process for Reliable Pattern Replication, J. Vac. Sci Technol. B, pp. 4124-4128 Nov. 1, 1996.

(Continued)

*Primary Examiner*—Calvin Lee
(74) *Attorney, Agent, or Firm*—Laura C. Robinson

(57) ABSTRACT

The present invention provides a method to pattern a substrate which features creating a multi-layered structure by forming, on the substrate, a patterned layer having protrusions and recessions. Formed upon the patterned layer is a conformal layer, with the multi-layered structure having a crown surface facing away from the substrate. Portions of the multi-layered structure are removed to expose regions of the substrate in superimposition with the protrusions, while forming a hard mask in areas of the crown surface in superimposition with the recessions.

14 Claims, 5 Drawing Sheets

U.S. PATENT DOCUMENTS

| | | | |
|---|---|---|---|
| 4,657,845 | A | 4/1987 | Frechet et al. |
| 4,665,007 | A | 5/1987 | Cservak et al. |
| 4,692,205 | A | 9/1987 | Sachdev et al. |
| 4,741,926 | A | 5/1988 | White et al. |
| 4,794,021 | A | 12/1988 | Potter |
| 4,891,303 | A | 1/1990 | Garza et al. |
| 4,931,351 | A | 6/1990 | McColgin et al. |
| 4,943,516 | A | 7/1990 | Kamayachi et al. |
| 4,959,252 | A | 9/1990 | Bonnebat et al. |
| 4,976,818 | A | 12/1990 | Hashimoto et al. |
| 5,015,602 | A | 5/1991 | Van Der Plas et al. |
| 5,071,694 | A | 12/1991 | Uekita et al. |
| 5,110,514 | A | 5/1992 | Soane |
| 5,173,393 | A | 12/1992 | Sezi et al. |
| 5,198,326 | A | 3/1993 | Hashimoto et al. |
| 5,212,114 | A | 5/1993 | Grewal et al. |
| 5,234,793 | A | 8/1993 | Sebald et al. |
| 5,240,550 | A | 8/1993 | Boehnke et al. |
| 5,259,926 | A | 11/1993 | Kuwabara et al. |
| 5,276,126 | A | 1/1994 | Rogler |
| 5,314,772 | A | 5/1994 | Kozicki et al. |
| 5,330,883 | A | 7/1994 | Garza et al. |
| 5,434,107 | A | 7/1995 | Paranjpe |
| 5,480,047 | A | 1/1996 | Tanigawa et al. |
| 5,488,007 | A | 1/1996 | Kim et al. |
| 5,545,367 | A | 8/1996 | Bae et al. |
| 5,700,626 | A | 12/1997 | Lee et al. |
| 5,743,998 | A | 4/1998 | Park |
| 5,772,905 | A | 6/1998 | Chou |
| 5,888,650 | A | 3/1999 | Calhoun et al. |
| 5,893,750 | A | 4/1999 | Hause et al. |
| 5,902,491 | A | 5/1999 | Carpentar et al. |
| 5,905,104 | A | 5/1999 | Eklund et al. |
| 5,907,782 | A | 5/1999 | Wu |
| 5,954,997 | A | 9/1999 | Kaufman et al. |
| 5,986,330 | A | 11/1999 | Kalnitsky et al. |
| 6,033,977 | A | 3/2000 | Gutsche et al. |
| 6,046,056 | A | 4/2000 | Parce et al. |
| 6,074,827 | A | 6/2000 | Nelson et al. |
| 6,096,655 | A | 8/2000 | Lee et al. |
| 6,232,175 | B1 | 5/2001 | Liu et al. |
| 6,326,627 | B1 | 12/2001 | Putvinski et al. |
| 6,329,256 | B1 | 12/2001 | Ibok |
| 6,334,960 | B1 | 1/2002 | Willson et al. |
| 6,342,097 | B1 | 1/2002 | Terry et al. |
| 6,355,198 | B1 | 3/2002 | Kim et al. |
| 6,387,787 | B1 | 5/2002 | Mancini et al. |
| 6,426,288 | B1 | 7/2002 | Meikle |
| 6,451,703 | B1 | 9/2002 | Liu et al. |
| 6,455,411 | B1 | 9/2002 | Jiang et al. |
| 6,468,896 | B2 | 10/2002 | Rohr et al. |
| 6,517,977 | B2 | 2/2003 | Resnick et al. |
| 6,562,465 | B1 | 5/2003 | Nakashima et al. |
| 6,703,190 | B2 | 3/2004 | Elian et al. |
| 6,716,767 | B2 | 4/2004 | Shih et al. |
| 6,719,915 | B2 | 4/2004 | Willson et al. |
| 6,730,256 | B1 | 5/2004 | Bloomstein et al. |
| 6,737,202 | B2 | 5/2004 | Gehoski et al. |
| 6,743,713 | B2 | 6/2004 | Mukher-Hee-Roy et al. |
| 6,767,983 | B1 | 7/2004 | Fujiyama et al. |
| 6,777,170 | B1 | 8/2004 | Bloomstein et al. |
| 6,814,879 | B2 | 11/2004 | Shibata |
| 6,820,677 | B2 | 11/2004 | Grinberg et al. |
| 6,893,975 | B1 | 5/2005 | Yue et al. |
| 6,894,245 | B2 | 5/2005 | Hoffman et al. |
| 7,041,604 | B2 | 5/2006 | Miller et al. |
| 7,179,396 | B2 * | 2/2007 | Sreenivasan ............... 216/44 |
| 7,186,656 | B2 | 3/2007 | Sreenivasan |
| 7,205,244 | B2 | 4/2007 | Stacey et al. |
| 7,241,395 | B2 | 7/2007 | Sreenivasan et al. |
| 7,252,777 | B2 | 8/2007 | Vidusek et al. |
| 7,256,131 | B2 * | 8/2007 | LaBrake ............... 438/710 |
| 7,259,102 | B2 | 8/2007 | Wang et al. |
| 7,261,831 | B2 * | 8/2007 | Sreenivasan ............... 216/44 |
| 2004/0029041 | A1 | 2/2004 | Shih et al. |
| 2004/0029372 | A1 | 2/2004 | Jang et al. |
| 2004/0029396 | A1 | 2/2004 | Zhang et al. |
| 2004/0211754 | A1 | 10/2004 | Sreenivasan |
| 2004/0224261 | A1 | 11/2004 | Resnick et al. |
| 2004/0250945 | A1 | 12/2004 | Zheng et al. |
| 2005/0199341 | A1 | 9/2005 | Delp et al. |
| 2005/0253307 | A1 | 11/2005 | Sreenivasan |
| 2006/0063112 | A1 | 3/2006 | Sreenivasan |
| 2007/0077763 | A1 | 4/2007 | Xu et al. |
| 2007/0082461 | A1 | 4/2007 | Sreenivasan |

FOREIGN PATENT DOCUMENTS

| | | |
|---|---|---|
| WO | WO 2005/031299 A2 | 4/2005 |
| WO | WO 2005/031855 A1 | 4/2005 |

OTHER PUBLICATIONS

Lin, Multi-Layer Resist Systems, Introduction to Microlithography, pp. 287-349 Feb. 14, 1983.

NERAC.COM Retro Search, Reduction of Dimension of Contact Holes, Aug. 31, 2004.

NERAC.COM Retro Search, Trim Etching of Features Formed on an Organic Layer, Sep. 2, 2004.

Luurtsema, Spin Coating from Rectangular Substrates, Retrieved May 23, 2002 from URL: http://buffy.eecs.berkelye.edu/IRO/Summary/97abstracts/gluurts.2.html May 23, 2002.

Photoresist Coating Methods, e-mail from Susan Bagen(Bagen@aol.com) to Dhaval Shah Sep. 18, 1997.

Nakamatsu et al., Bilayer Resist Method for Room-Temperature Nanoimprint Lithography, Japanese Journal of Applied Physics, vol. 43, No. 6B, pp. 4050-4053 Jun. 29, 2004.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lectures/lecture_2/materials/materials.html Mar. 31, 2005.

Data Sheet for Cymel 303ULF, www.cytec.com.

Data Sheet for Cycat 4040, www.cytec.com.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition.

Data Sheet for Dow Corning Z-6018.

Data Sheet for Methyl Amyl Ketone, www.arb.ca.gov/db/solvents/solvent_pages/Ketones-HTML/methyl_amyl.htm Mar. 31, 2005.

Miller et al., Fabrication of Nanometer Sized Features on Non-Flat Substrates Using a Nano-Imprint Lithography Process, SPIE Microlithography Conference Feb. 1, 2005.

Stewart et al., Direct Imprinting of Dielectric Materials for Dual Damascene Processing, SPIE Microlithogrpahy Conference Feb. 1, 2003.

Smith et al. Employing Step and Flash Imprint Lithography for Gate Level Patterning of a MOSFET Device, SPIE Microlithography Conference Feb. 1, 2003.

Peurrung et al., Film Thickness Profiles over Topography in Spin Coating, J. Electrochem. Soc., vol. 138, No. 7 Jul. 1, 1991.

Wolf et al., Silicon Processing for the VLSI era, vol. 1; Process Technology, pp. 546-547 Jan. 1, 1986.

Bender, Multiple Imprinting in UV-based Nanoimprint Lithography: Related Material Issues, Microelectronic Engineering 61-62, pp. 407-413, Amsterdam NL 1989.

Optical and sub-optical imaging technique using optical imaging, IBM Technical Bulletin, IBM Corp, NY, US 2002.

* cited by examiner

POSITIVE TONE BI-LAYER METHOD

CROSS-REFERENCE TO RELATED PATENT APPLICATION

This application is a continuation patent application of U.S. patent application Ser. No. 11/611,287 filed Dec. 15, 2006 now U.S. Pat. No. 7,323,417 and entitled "Method of Forming a Recessed Structure Employing a Reverse Tone Process," which is a continuation of U.S. patent application Ser. No. 10/946,570 filed Sep. 21, 2004 and entitled "Method of Forming a Recessed Structure Employing a Reverse Tone Process," which is a continuation-in-part of U.S. patent application Ser. No. 10/850,876 filed May 21, 2004 and entitled "Method of Forming a Recessed Structure Employing a Reverse Tone Process." This application is also a continuation patent application of U.S. patent application Ser. No. 11/560,928 filed Nov. 17, 2006, now U.S. Pat. No. 7,261,831 and entitled "Positive Tone Bi-Layer Imprint Lithography Method," which is a continuation of U.S. patent application Ser. No. 10/396,615 filed Mar. 25, 2003 and entitled "Positive Tone Bi-Layer Imprint Lithography Method." All of these applications are incorporated herein by reference.

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. An imprint device makes mechanical contact with the polymerizable fluid. The imprint device includes a relief structure formed from lands and grooves. The polymerizable fluid composition fills the relief structure, with the thickness of the polymerizable fluid in superimposition with the lands defining a residual thickness. The polymerizable fluid composition is then subjected to conditions to solidify and polymerize the same, forming a solidified polymeric material on the transfer layer that contains a relief structure complimentary to that of the imprint device. The imprint device is then separated from the solid polymeric material such that a replica of the relief structure in the imprint device is formed in the solidified polymeric material. The transfer layer and the solidified polymeric material are subjected to an environment to selectively etch the transfer layer relative to the solidified polymeric material such that a relief image is formed in the transfer layer. Thereafter, conventional etching processes may be employed to transfer the pattern of the relief structure into the substrate.

It is desired to minimize dimensional variations between the pattern recorded in the polymeric material from the pattern transferred into the substrate, referred to as transfer distortions. To that end, many attempts have been made to advance the micro-fabrication technique of Willson et al. For example, it has been desired to minimize the residual thickness of the solidified polymeric material. The thinner the residual thickness, the greater reduction in transfer distortions. The residual thickness of the solidified polymeric material is proportional to the residual thickness of the polymerizable fluid. However, the rate at which the polymerizable fluid fills the relief structure is inversely proportional to the cube of the residual thickness of polymerizable fluid. It is manifest that minimizing the transfer distortions increases the time required to record the pattern in the substrate. Thus, a tradeoff exists between throughput and minimization of transfer distortions.

It is desired, therefore, to improve the throughput of micro-fabrication techniques while minimizing transfer distortions in patterns formed by these techniques.

SUMMARY OF THE INVENTION

The present invention provides a method to pattern a substrate that involves creating a multi-layered structure by forming, on the substrate, a patterned layer having protrusions and recessions. Formed upon the patterned layer is a conformal layer, with the multi-layered structure having a crown surface facing away from the substrate. Portions of the multi-layered structure are removed to expose regions of the substrate in superimposition with the protrusions, while forming a hard-mask in areas of the crown surface in superimposition with the recessions. In an exemplary embodiment, the patterned layer is formed from a substantially silicon-free polymerizable fluid employing imprint lithography techniques to form a silicon-free polymerized layer. The conformal layer is formed from a silicon-containing polymerized fluid and has a normalization surface that faces away from said substrate. Portions of the silicon-containing polymerized layer are removed employing a blanket etch to define a crown surface with the protrusions in the silicon-free polymerized layer being exposed. Then the crown surface is subjected to an anisotropic oxygen plasma etch that creates a hard mask in the regions of the crown surface in superimposition with the recessions, while removing the protrusions and segments of the silicon-free containing layer in superimposition therewith to expose the substrate. As a result of this process, patterning time is reduced while maintaining precise control over the dimensions in the pattern formed. These and other embodiments are described herein.

DETAILED DESCRIPTION OF THE INVENTION

Figure 1:
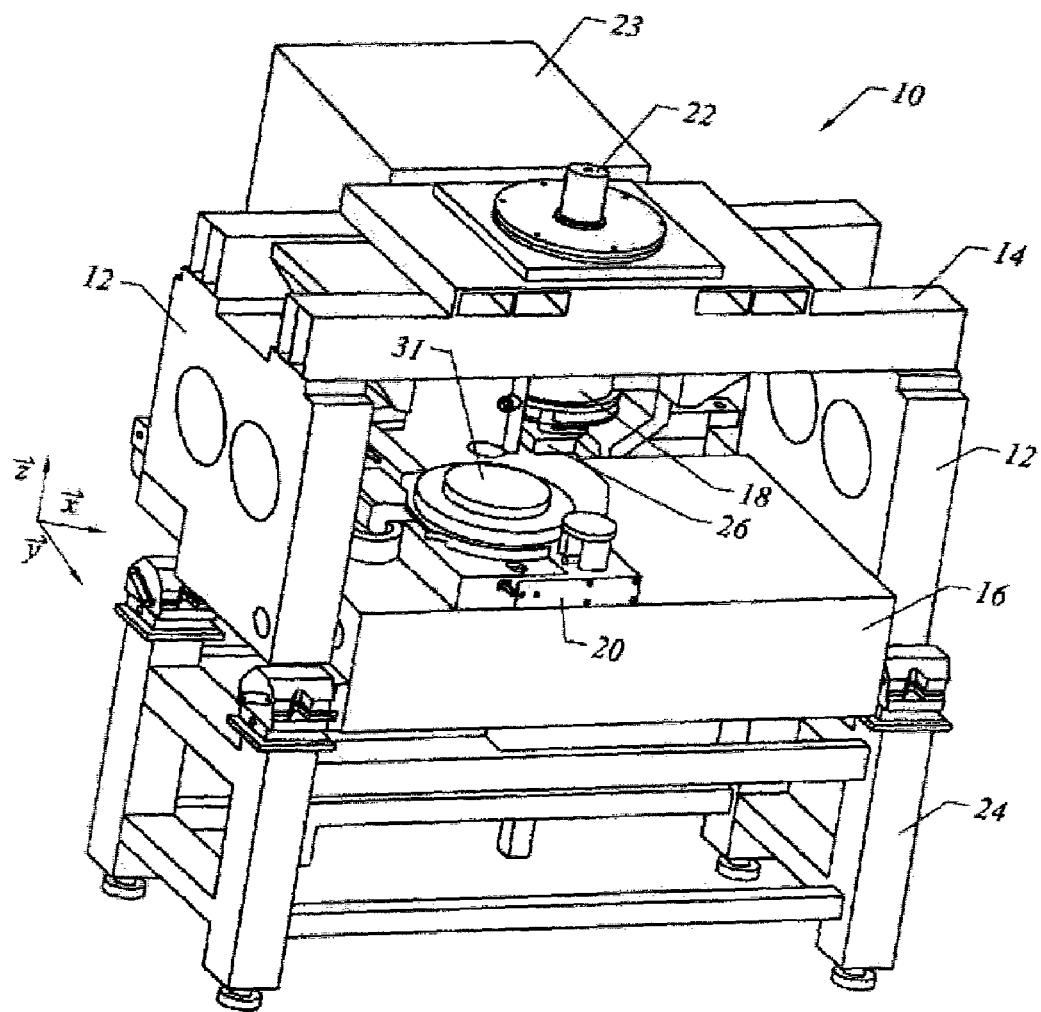
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
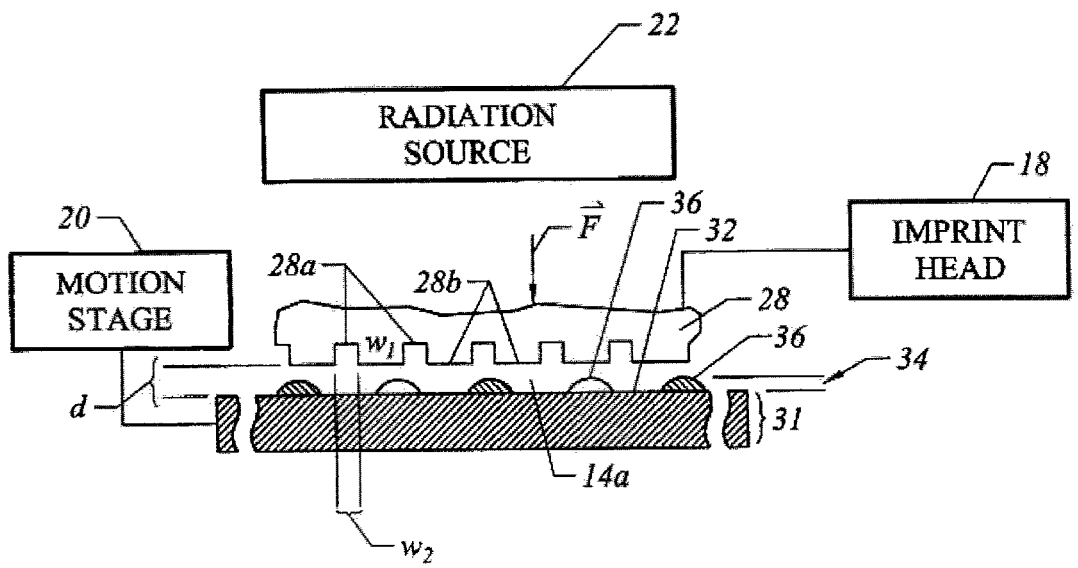
FIG. 2 is a simplified elevation view of a lithographic system, shown in FIG. 1, employed to create a patterned imprinting layer in accordance with the present invention.

Referring to both FIGS. 1 and 2, connected to imprint head 18 is a substrate 26 having a patterned mold 28 thereon. Patterned mold 28 includes a plurality of features defined by a plurality of spaced-apart recesses 28a and projections 28b. Projections 28b have a width $W_1$, and recesses 28a have a width $W_2$, both of which are measured in a direction that extends transversely to Z axis. The plurality of features defines an original pattern that is to be transferred into a wafer 31 positioned on motion stage 20. To that end, imprint head 18 is adapted to move along the Z axis and vary a distance "d" between patterned mold 28 and wafer 31. Alternatively, or in conjunction with imprint head 18, motion stage 20 may move substrate 26 along the Z-axis. In this manner, the features on patterned mold 28 may be imprinted into a flowable region of wafer 31, discussed more fully below. Radiation source 22 is located so that patterned mold 28 is positioned between radiation source 22 and wafer 31. As a result, patterned mold 28 is fabricated from material that allows it to be substantially transparent to the radiation produced by radiation source 22.

Figure 3:
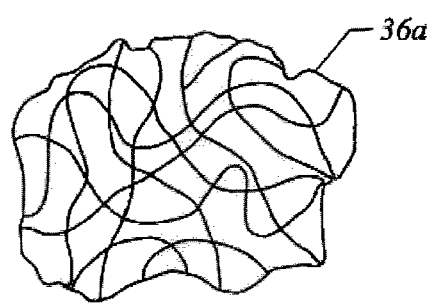
FIG. 3 is a simplified representation of material from which a patterned imprinting layer, shown in FIG. 2, is comprised before being polymerized and cross-linked in accordance with the present invention.

Referring to both FIGS. 2 and 3, a flowable region, such as a patterned imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, flowable region consists of patterned imprinting layer 34 being deposited as a plurality of spaced-apart discrete beads 36 of material 36a on wafer 31, discussed more fully below. Patterned imprinting layer 34 is formed from a substantially silicon-free material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
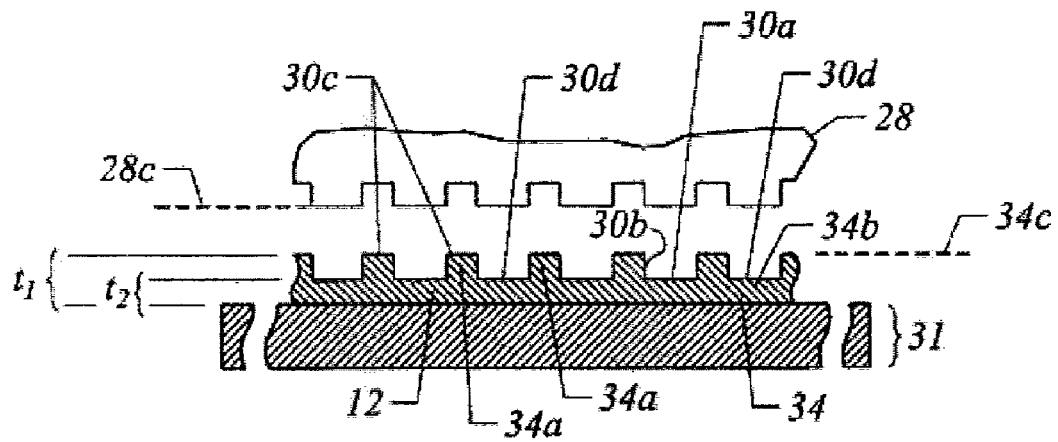
FIG. 5 is a simplified elevation view of an imprint device spaced-apart from the patterned imprinting layer, shown in FIG. 1, after patterning in accordance with the present invention.

Referring to FIGS. 2, 3 and 5, the pattern recorded in patterned imprinting layer 34 is produced, in part, by mechanical contact with patterned mold 28. To that end, imprint head 18 reduces the distance "d" to allow patterned imprinting layer 34 to come into mechanical contact with patterned mold 28, spreading beads 36 so as to form patterned imprinting layer 34 with a contiguous formation of material 36a over surface 32. In one embodiment, distance "d" is reduced to allow sub-portions 34a of patterned imprinting layer 34 to ingress into and fill recesses 28a.

To facilitate filling of recesses 28a, material 36a is provided with the requisite properties to completely fill recesses 28a while covering surface 32 with a contiguous formation of material 36a. In the present embodiment, sub-portions 34b of patterned imprinting layer 34 in superimposition with projections 28b remain after the desired, usually minimum distance "d", has been reached, leaving sub-portions 34a with a thickness, $t_1$ and sub-portions 34b with a thickness, $t_2$. Thickness $t_2$ is referred to as a residual thickness. Thicknesses "$t_1$" and "$t_2$" may be any thickness desired, dependent upon the application.

Figure 4:
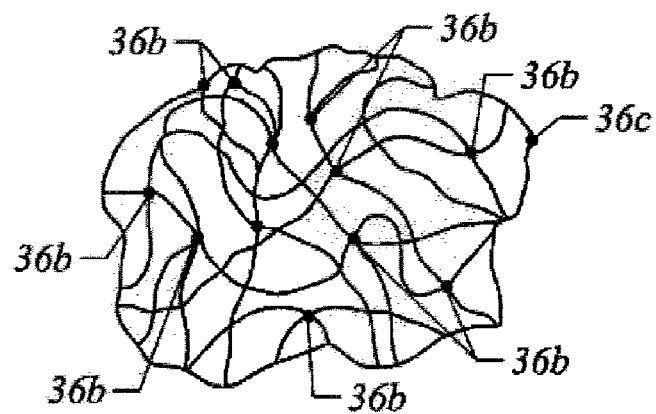
FIG. 4 is a simplified representation of cross-linked polymer material into which the material shown in FIG. 3 is transformed after being subjected to radiation in accordance with the present invention.

Referring to FIGS. 2, 3 and 4, after a desired distance "d" has been reached, radiation source 22 produces actinic radiation that polymerizes and cross-links material 36a, forming cross-linked polymer material 36c. As a result, the composition of patterned imprinting layer 34 transforms from material 36a to material 36c, which is a solid. Specifically, material 36c is solidified to provide side 34c of patterned imprinting layer 34 with a shape conforming to a shape of a surface 28c of patterned mold 28, shown more clearly in FIG. 5, with patterned imprinting layer 34 having recessions 30a and protrusions 30b. After patterned imprinting layer 34 is transformed to consist of material 36c, shown in FIG. 4, imprint head 18, shown in FIG. 2, is moved to increase distance "d" so that patterned mold 28 and patterned imprinting layer 34 are spaced-apart.

In a further embodiment, recessions 30a and protrusions 30b of imprinting layer 34 may be formed by such techniques including, but not limited to, photolithography (various wavelengths including G line, I line, 248 nm, 193 nm, 157 nm, and 13.2-13.4 nm), e-beam lithography, x-ray lithography, ion-beam lithography, and atomic beam lithography.

Figure 6:
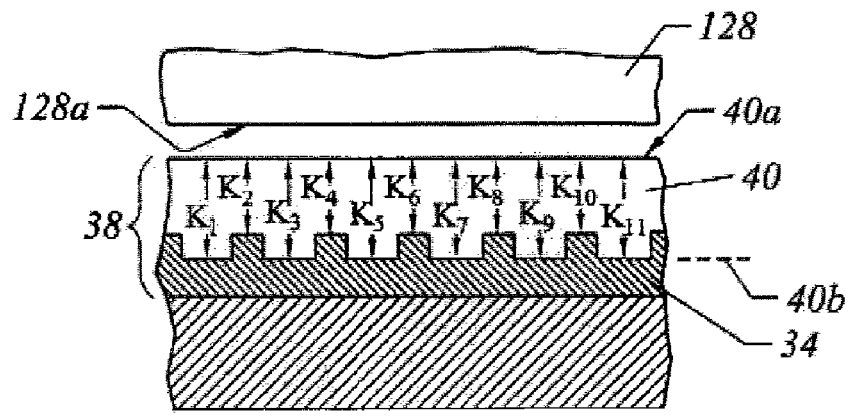
FIG. 6 is a simplified elevation view of a lithographic system, shown in FIG. 1, after formation of a multi-layered structure by deposition of a conformal layer, adjacent to the patterned imprinting layer, employing a mold in accordance with one embodiment of the present invention.

Referring to FIG. 6, additional processing is employed to form a multi-layered structure 38 by forming a conformal layer 40 adjacent to patterned imprinting layer 34. One manner in which to form conformal layer 40 is to employ imprint lithography processes, such as those discussed above with respect to depositing patterned imprinting layer 34. To that end, conformal layer 40 may be formed from a polymerizable material similar to that described above with respect to FIGS. 3 and 4, excepting that the material from which conformal layer 40 is formed includes silicon, i.e., is a silicon-containing polymerizable material. Conformal layer 40 includes first and second opposed sides. First side 40b faces patterned imprinting layer 34 and has a profile complementary to the profile of the patterned imprinting layer 34. The second side faces away from patterned imprinting layer 34 forming normalization surface 40a. Normalization surface 40a is provided with a substantially normalized profile, by ensuring that the distances, $k_2$, $k_4$, $k_6$, $k_8$ and $k_{10}$, between the apex 30c, shown in FIG. 5, of each of the protrusions 30b and normalization surface 40a are substantially the same and that the distance, $k_1$, $k_3$, $k_5$, $k_7$, $k_9$ and $k_{11}$ between a nadir surface 30d of each of the recessions 30a and normalization surface 40a are substantially the same.

One manner in which to provide normalization surface 40a with a normalized profile, a planarizing mold 128 having a planar surface 128a is employed to come into contact with conformal layer 40. As mentioned above, this may be accomplished by moving imprint head 18, shown in FIG. 2, along the Z-axis, moving motion stage 20 along the Z-axis, or both. Thereafter, mold 128 is separated from conformal layer 40 and actinic radiation impinges upon conformal layer 40 to polymerize and, therefore, solidify the same. Alternatively, conformal layer 40 may be applied employing spin-on techniques. Spin-on deposition of conformal layer 40 may be beneficial when recording patterns having numerous features per unit area, i.e., a dense featured pattern.

Figure 7:
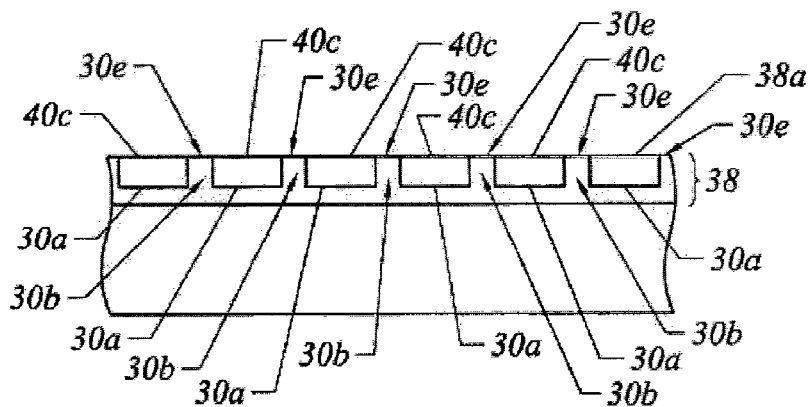
FIG. 7 is a simplified elevation view after a blanket etch of the multi-layered structure, shown in FIG. 6, after formation of a crown surface in the conformal layer with portions of the patterned imprinting layer being exposed in accordance with one embodiment of the present invention.

Referring to FIGS. 6 and 7, a blanket etch is employed to remove portions of conformal layer 40 to provide multi-layered structure 38 with a crown surface 38a. Crown surface 38a is defined by an exposed surface 30e of each of protrusions 30b and upper surfaces of portions 40c that remain on conformal layer 40 after the blanket etch.

Figure 8:
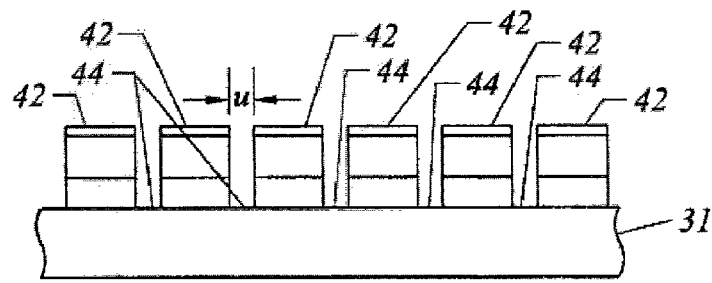
FIG. 8 is a simplified elevation view of the multi-layered structure, shown in FIG. 7, after subjecting the crown surface to an anisotropic etch to expose regions of a substrate in accordance with the present invention.

Referring to FIGS. 7 and 8, crown surface 38a is subjected to an anisotropic etch. The etch chemistry of the anisotropic etch is selected to maximize etching of protrusions 30b and the segments of patterned imprinting layer 34, shown in FIG. 6, in superimposition therewith, while minimizing etching of the portions 40c in superimposition with recessions 30a. In the present example, advantage was taken of the distinction of the silicon content between the patterned imprinting layer 34 and the conformal layer 40. Specifically, employing a plasma etch with an oxygen-based chemistry, it was determined that an in-situ hardened mask 42 would be created in the regions of portions 40c proximate to surface 38a. This results from the interaction of the silicon-containing polymerizable material with the oxygen plasma. As a result of the hardened mask 42 and the anisotropicity of the etch process, regions 44 of wafer 31 in superimposition with protrusions 30b are exposed. The width U' of regions 44 is optimally equal to width $W_2$, shown in FIG. 2.

Referring to FIGS. 2, 7 and 8, the advantages of this process are manifold. For example, the relative etch rate between portions 40c and exposed surfaces 30e may be in a range of about 1.5:1 to about 100:1 due to the presence of the hardened mask 42. As a result, the dimensional width U' of regions 44 may be precisely controlled, thereby reducing transfer distortions of the pattern into wafer 31.

Figure 11:
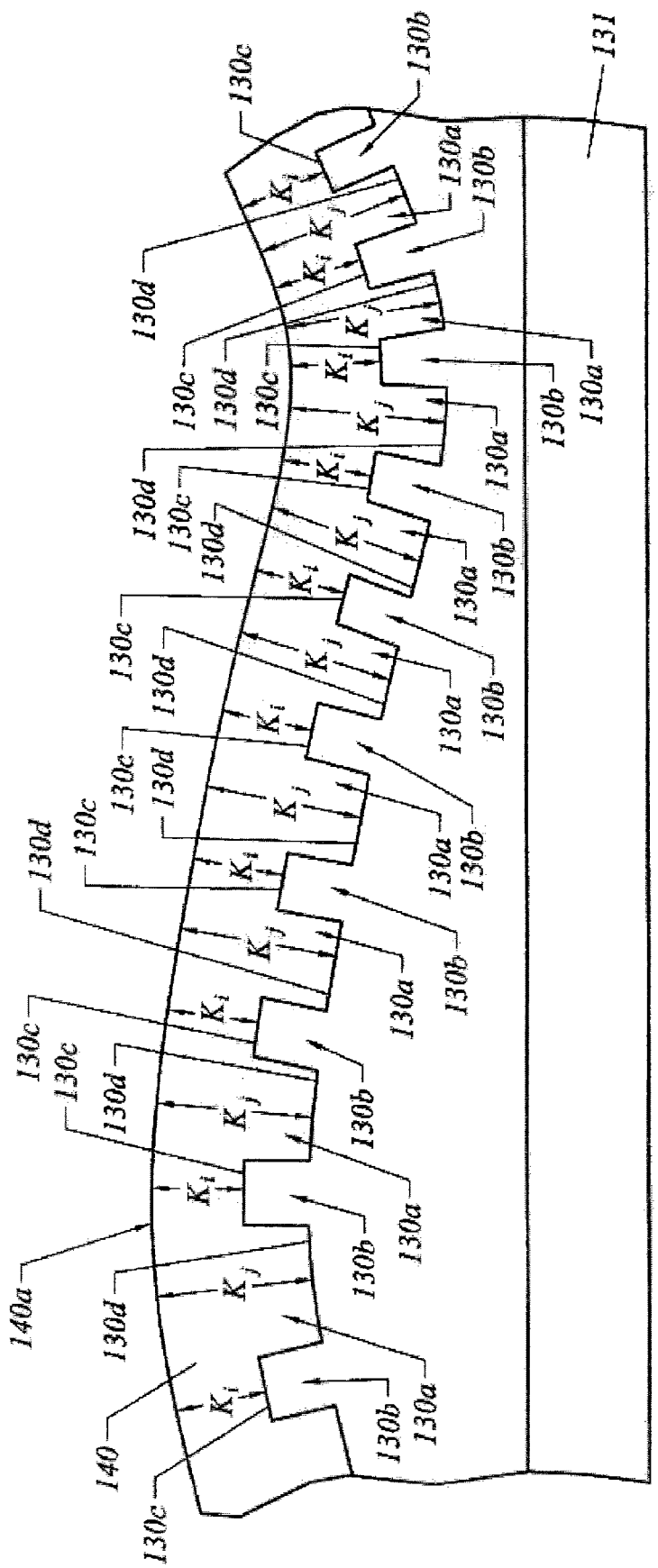
FIG. 11 is a simplified elevation view of a multi-layered structure after deposition of a conformal layer in accordance with an alternate embodiment of the present invention.

Referring to FIGS. 1, 5 and 11 additionally, the control of dimensional width U' becomes relatively independent of residual thickness $t_2$. The rate at which the polymerizable fluid fills the pattern on mold 28 is inversely proportional to the cube of residual thickness $t_2$. As a result, residual thickness $t_2$ may be selected to maximize throughput without substantially increasing transfer distortions. Decoupling of the transfer distortions from residual thickness $t_2$ facilitates patterning non-planar surfaces without exacerbating transfer distortions. This is particularly useful when mold 28 is deformed due to external forces, such as typically occurs when varying the dimensions of mold 28 when effectuating magnification correction. As a result, deformation in mold patterned imprinting layer 34 may have a profile in which apex 130c of protrusions 130b are not coplanar and/or nadir surface 130d of recessions 130a are not coplanar.

To attenuate the transfer distortions that may result from this profile, conformal layer 140 is deposited so that distances, $k_i$, between the apex 130c of each of the protrusions 130b and normalization surface 140a satisfies the following parameter:

$$|k_{i_{min}} - k_{i_{max}}| < t_3$$

where $k_{i_{min}}$ is smallest value for $k_i$ and $k_{i_{max}}$ is the greatest value for $k_i$ and $t_3$ is the height of protrusion 130b measured between apex 130c and nadir surface 130d. Thus, the constraint on the normalization provided by normalization surface 140a may be relaxed so as not to require each value of $k_i$ to be substantially identical. To that end, conformal layer 140 may be applied by either spin-coating techniques or imprint lithography techniques. Thereafter, stage 20 is employed to move substrate 131 along the Z-axis to compress conformal layer 140 against a planar surface, such as mold 28. Alternatively, mold 28 may be moved against normalization surface 140a or both.

Finally, forming patterned imprinting layer 34 from a substantially silicon-free polymerizable fluid eases the cleaning process of mold 28, especially considering that mold 28 is often formed from fused silica.

Referring to both FIGS. 1 and 2, an exemplary radiation source 22 may produce ultraviolet radiation. Other radiation sources may be employed, such as thermal, electromagnetic and the like. The selection of radiation employed to initiate the polymerization of the material in patterned imprinting layer 34 is known to one skilled in the art and typically depends on the specific application which is desired. Furthermore, the plurality of features on patterned mold 28 are shown as recesses 28a extending along a direction parallel to projections 28b that provide a cross-section of patterned mold 28 with a shape of a battlement. However, recesses 28a and projections 28b may correspond to virtually any feature required to create an integrated circuit and may be as small as a few tenths of nanometers.

It may be desired to manufacture components of system 10 from materials that are thermally stable, e.g., have a thermal expansion coefficient of less than about 10 ppm/degree Centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade-name INVAR®, or trade-name SUPER INVAR™, ceramics, including but not limited to ZERODUR® ceramic. Additionally, table 24 may be constructed to isolate the remaining components of system 10 from vibrations in the surrounding environment. An exemplary table 24 is available from Newport Corporation of Irvine, Calif.

Referring to FIGS. 1, 2 and 5, the pattern produced by the present patterning technique may be transferred into wafer 31 provided features have aspect ratios as great as 30:1. To that end, one embodiment of patterned mold 28 has recesses 28a defining an aspect ratio in a range of 1:1 to 10:1. Specifically, projections 28b have a width $W_1$ in a range of about 10 nm to about 5000 μm, and recesses 28a have a width $W_2$ in a range of 10 nm to about 5000 μm. As a result, patterned mold 28 and/or substrate 26, may be formed from various conventional materials, such as, but not limited to, fused-silica, quartz, silicon, organic polymers, siloxane polymers, borosilicate glass, fluorocarbon polymers, metal, and combinations of the above.

Referring to FIGS. 1, 2 and 3, the characteristics of material 36a are important to efficiently pattern wafer 31 in light of the unique deposition process employed. As mentioned above, material 36a is deposited on wafer 31 as a plurality of discrete and spaced-apart beads 36. The combined volume of beads 36 is such that the material 36a is distributed appropriately over area of surface 32 where patterned imprinting layer 34 is to be formed. As a result, patterned imprinting layer 34 is spread and patterned concurrently, with the pattern being subsequently set by exposure to radiation, such as ultraviolet radiation. As a result of the deposition process it is desired that material 36a have certain characteristics to facilitate rapid and even spreading of material 36a in beads 36 over surface 32 so that all thicknesses $t_1$ are substantially uniform and all residual thicknesses $t_2$ are substantially uniform.

Figure 9:
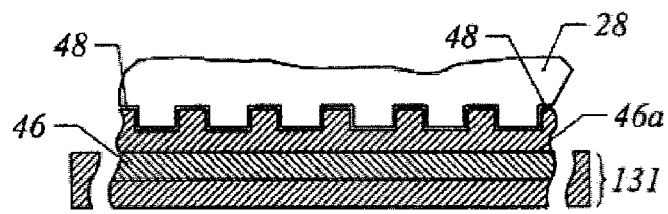
FIG. 9 is a simplified elevation view of material in an imprint device and substrate employed with the present invention in accordance with an alternate embodiment of the present invention.

Referring to FIGS. 2 and 9, employing the compositions described above in material 36a, shown in FIG. 3, to facilitate imprint lithography is achieved by including, on substrate 131, a primer layer 46. Primer layer 46 functions, inter alia, to provide a standard interface with patterned imprinting layer 34, thereby reducing the need to customize each process to the material from which substrate 131 is formed. In addition, primer layer 46 may be formed from an organic material with the same etch characteristics as patterned imprinting layer 34. Primer layer 46 is fabricated in such a manner so as to possess a continuous, smooth, relatively defect-free surface that may exhibit excellent adhesion to patterned imprinting layer 34.

Figure 10:
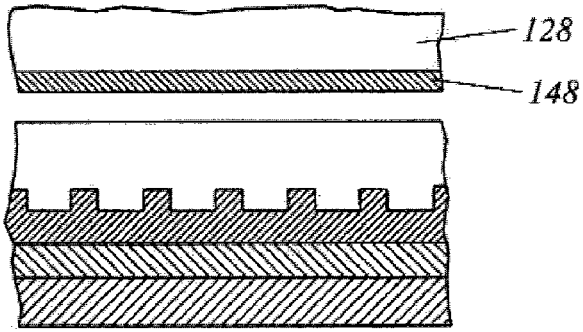
FIG. 10 is a simplified elevation view of a lithographic system, shown in FIG. 1, after formation of a multi-layered structure by deposition of a conformal layer, adjacent to the patterned imprinting layer, employing a planarized mold in accordance with an alternate embodiment of the present invention.

Additionally, to ensure that patterned imprinting layer 34 does not adhere to patterned mold 28, surface 28c, shown in FIG. 5, may be treated with a low surface energy coating 48. As a result, patterned imprinting layer 34 is located between primer layer 46 and coating 48 upon contact of mold 28 with substrate 131. Coating 48 may be applied using any known process. For example, processing techniques may include chemical vapor deposition method, physical vapor deposition, atomic layer deposition or various other techniques, brazing and the like. In a similar fashion a low surface energy coating 148 may be applied to planarizing mold 128, shown in FIG. 10. Alternatively, release properties of either patterned imprinting layer 34 or conformal layer 140, shown in FIG. 11, may be improved by including, in the material from which the same is fabricated, a compound having low surface energy, referred to as a surfactant. The compound is caused to migrate to a surface of the layer formed therewith to interface with mold 28 using known techniques. Typically, the surfactant has a surface energy associated therewith that is lower than a surface energy of the polymerizable material in the layer. An exemplary material and process by which to form the aforementioned surfactant is discussed by Bender et al. in MULTIPLE IMPRINTING IN UV-BASED NANOIMPRINT LITHOGRAPHY: RELATED MATERIAL ISSUES, Microelectronic Engineering pp. 61-62 (2002). The low surface energy of the surfactant provides the desired release properties to reduce adherence of either imprinting layer 34 or conformal layer 40 to mold 28. It should be understood that the surfactant may be used in conjunction with, or in lieu of, low surface energy coatings 48 and 148.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

The invention claimed is:

1. A method of patterning a substrate, said method comprising:
   creating a multi-layered structure with e-beam lithography by forming, on said substrate, a patterned layer having protrusions and recessions, and spin-coating a polymerizable material upon said patterned layer, defining a conformal layer, with said multi-layered structure having a crown surface facing away from said substrate; and
   selectively removing portions of said multi-layered structure to expose regions of said substrate in superimposition with said protrusions while forming a hard mask in areas of said crown surface in superimposition with said recessions.

2. The method as recited in claim 1 wherein forming said patterned layer further includes providing said protrusions with an apex and a height and forming said conformal layer further includes providing said conformal layer with a normalization surface spaced-apart from one apex a minimum distance and spaced-apart from an additional apex a maximum distance with said height being greater than a difference between said maximum distance and said minimum distance.

3. The method as recited in claim 1 wherein creating further includes forming said conformal layer from a silicon-containing polymerizable material.

4. The method as recited in claim 1 wherein creating further includes forming said conformal layer by disposing, on said substrate, a polymerizable fluid composition and contacting said polymerizable fluid composition with a mold having a substantially planar surface and subjecting said polymerizable fluid composition to conditions to polymerize said polymerizable fluid composition.

5. The method as recited in claim 1 further including depositing a primer layer between said patterned layer and said substrate.

6. The method as recited in claim 1 wherein creating further includes forming said conformal layer with a section having a normalization surface disposed opposite to said patterned layer and spaced-apart from said protrusions, and further including removing portions of said section to expose said protrusions, defining said crown surface and exposing said crown surface to an etch chemistry.

7. The method as recited in claim 6 wherein removing portions further includes subjecting said normalization surface to a blanket etch and exposing said crown surface further includes subjecting said crown surface to an anisotropic plasma etch.

8. A method of patterning a substrate, said method comprising:
   creating a multi-layered structure with e-beam lithography by forming, on said substrate, a patterned layer having protrusions and recessions, by disposing, on said substrate, a polymerizable fluid composition and contacting said polymerizable fluid composition with a surface of a mold, and subjecting said polymerizable fluid composition to conditions to polymerize said polymerizable fluid composition, forming said patterned layer, and forming, upon said patterned layer, a conformal layer, with said multi-layered structure having a crown surface facing away from said substrate; and selectively removing portions of said multi-layered structure to expose regions of said substrate in superimposition with said protrusions while forming a hard mask in areas of said crown surface in superimposition with said recessions.

9. The method as recited in claim 8 wherein forming said patterned layer further includes providing said protrusions with an apex and a height and forming said conformal layer further includes providing said conformal layer with a normalization surface spaced-apart from one apex a minimum distance and spaced-apart from an additional apex a maximum distance with said height being greater than a difference between said maximum distance and said minimum distance.

10. The method as recited in claim 8 wherein creating further includes forming said conformal layer from a silicon-containing polymerizable material.

11. The method as recited in claim 8 wherein forming said conformal layer further includes spin-coating a polymerizable fluid on said patterned layer.

12. The method as recited in claim 8 further including depositing a primer layer between said patterned layer and said substrate.

13. The method as recited in claim 8 wherein creating further includes forming said conformal layer with a section having a normalization surface disposed opposite to said patterned layer and spaced-apart from said protrusions, and further including removing portions of said section to expose said protrusions, defining said crown surface and exposing said crown surface to an etch chemistry.

14. The method as recited in claim 13 wherein removing portions further includes subjecting said normalization surface to a blanket etch and exposing said crown surface further includes subjecting said crown surface to an anisotropic plasma etch.

* * * * *